United States Patent
Adamjee

[11] Patent Number: 5,559,054
[45] Date of Patent: Sep. 24, 1996

[54] METHOD FOR BALL BUMPING A SEMICONDUCTOR DEVICE

[75] Inventor: Waseem Adamjee, Austin, Tex.

[73] Assignee: Motorola, Inc., Schaumburg, Ill.

[21] Appl. No.: 363,112

[22] Filed: Dec. 23, 1994

[51] Int. Cl.⁶ .................................................. H01L 21/60
[52] U.S. Cl. .................................... 437/183; 228/179.1
[58] Field of Search ........................... 228/180.5, 180.22, 228/179.1; 437/183

[56] References Cited

U.S. PATENT DOCUMENTS

| | | | |
|---|---|---|---|
| 4,442,967 | 4/1984 | van de Pas et al. | 228/179.1 X |
| 4,661,192 | 4/1987 | McShane | 156/292 |
| 5,014,111 | 5/1991 | Tsuda et al. | 228/179.1 X |
| 5,058,798 | 10/1991 | Yamazaki et al. | 228/110 |
| 5,060,843 | 10/1991 | Yasuzato et al. | 228/179.1 |
| 5,172,851 | 12/1992 | Mastsushita et al. | 228/180.22 |

FOREIGN PATENT DOCUMENTS

| | | | |
|---|---|---|---|
| 2-250328 | 10/1990 | Japan | H01L 21/321 |
| 5-47770 | 2/1993 | Japan | H01L 21/321 |
| 5-275428 | 10/1993 | Japan | H01L 21/321 |

OTHER PUBLICATIONS

B. Nachon; "Ball Bonding With Capillaries, The Basics of Wire Bonding," Kulicke & Soffa Industries, Inc. Applications Brochure (pp. 1–12), Copyright 1992.

Primary Examiner—Kenneth J. Ramsey
Attorney, Agent, or Firm—Patricia S. Goddard

[57] ABSTRACT

A ball bump is formed on a semiconductor die (12) by lowering a capillary (18) and a conductive wire (20) having a ball (30) formed at its end toward the die. The ball is pressed against a bond pad (14) of the die to form a ball bond (32). The capillary is then raised and horizontally displaced without breaking the wire. The capillary is then lowered such that one side of a bottom face (22) of the capillary is used to flatten the ball bond to form a flattened ball bump (38). In lowering the capillary, an entire width (W) of the bottom face lies over and is in contact with the entire top surface of the ball bump, and a chamfer (26) and feed hole (24) are located at or beyond a perimeter of the ball bump. The wire is then clamped and the capillary raised to break the wire from the ball bump.

20 Claims, 3 Drawing Sheets

METHOD FOR BALL BUMPING A SEMICONDUCTOR DEVICE

FIELD OF THE INVENTION

The present invention relates to semiconductor devices in general, and more specifically to a method for forming ball bumps on a semiconductor device.

BACKGROUND OF THE INVENTION

In many semiconductor applications, it is necessary or at least desirable to form conductive bumps on the input and output terminals (bond pads) of a semiconductor die. The most common applications where conductive bumps are used include tape automated bonding (TAB), flip-chip attachment of a die to an intermediate substrate, and direct chip attachment (DCA) of a die to a user substrate. A variety of methods exist for forming conductive bumps for these applications. One method involves depositing metal onto the bond pads, for example by electro-plated deposition or through evaporative deposition. Due to high manufacturing costs, however, use of these deposition techniques is not always favored.

As a replacement for methods which form conductive bumps through deposition, some semiconductor manufacturers have resorted to a method known as ball bumping. Ball bumping utilizes a standard wire bonding tool. Unlike conventional wire bonding, where a bond is first formed to the bond pad of a die and then a second bond is formed to a lead or a conductive pad on a substrate (with the wire being continuous between the two bonds), conventional ball bonding utilizes only one bond. A capillary of the wire bonding tool brings a conductive wire toward the bond pad on which a bump is to be formed. The conductive wire is heated to melt the metal at an end of the wire to form a ball, and the capillary forcibly presses the ball against the bond pad. The wire is then cut, leaving a kiss-shaped bump (known as a ball bump) on the bond pad. Because the ball bump is not flat, a subsequent flattening operation may be necessary for some applications. For example, in TAB bonding, it is important that the ball bump be flat so that fragile TAB leads can be bonded to the ball bumps reliably and repeatedly, without slipping off the bump surface.

A few methods for flattening the ball bumps have been proposed. One method involves forming ball bumps on all bond pads of the semiconductor die, and subsequently coining all ball bumps at the same time by pressing the die against a flat surface. A problem with this technique is that it involves two separate operations and handling steps, one to form the bumps, and one to coin them. Another proposed method is to utilize the capillary of the wire bonding tool to shear off the protruding tail portion of the ball bump. A disadvantage of a shearing technique is that the wire can break inside the capillary, thereby clogging it. Others have proposed individually coining each ball bump as it is formed. For example, after forming the ball bump, a flat metal wedge may be used to squash each bump after being formed. It has also been proposed that the capillary itself may be used to flatten the ball bump; however, in processes which propose use of the capillary for flattening, a protrusion on the bump surface still remains.

Accordingly, there is a need for an improved ball bumping process wherein the ball bump formed has an essentially flat top surface, and wherein the process for forming such bumps can be done with minimal manufacturing time and expense.

DETAILED DESCRIPTION OF A PREFERRED EMBODIMENT

Figure 1:
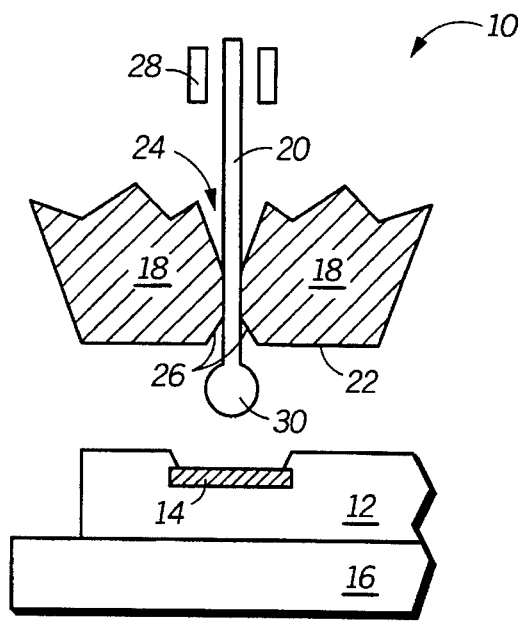
FIGS. 1–6 illustrate in a cross-sectional view a process for forming a ball bump on a semiconductor die in accordance with the present invention.

Generally, the present invention is a method for forming ball bumps on a semiconductor device which utilizes simultaneous bumping and coining. A ball bond is first formed on a bond pad of a semiconductor die. The ball bond is formed by lowering a capillary with a conductive wire therein to the bond pad and forcibly pressing a ball which is formed at the end of the wire against the bond pad. After forming the bond, the capillary is raised and then horizontally displaced. The capillary is again lowered such that a flat bottom face of the capillary presses against the previously formed ball bond thereby flattening the ball bond. The extent of the horizontal displacement of the capillary is such that upon lowering the capillary for the second time an entire width of the bottom face of the capillary is used to flatten the ball bond. In other words, the entire diameter of the ball bond is flattened by the bottom face of the capillary. An advantage in using the entire bottom face of the capillary for coining is that a chamfer of the capillary and the capillary feed hole are at or beyond a perimeter of the ball bump. Thus, upon clamping the wire and withdrawing the capillary after flattening, the conductive wire breaks beyond the perimeter of the ball bump. Any protrusion which may be left as a result of breaking the wire is thus formed beyond the perimeter of the ball bump rather than on the top of the ball bump. Using a method in accordance with the present invention, the ball bump has a top surface which is not only flat, but which has a diameter essentially equal to the overall ball bump diameter.

These and other features and advantages will be more clearly understood from the following detailed description taken in conjunction with the accompanying drawings. It is important to point out that the illustrations may not necessarily be drawn to scale, and that there may be other embodiments of the present invention which are not specifically illustrated. Throughout the various views, like reference numerals may be used to designate identical or corresponding parts.

FIGS. 1–6 sequentially illustrate a method for forming a ball bump in accordance with the present invention. Each of the illustrations are in cross-section, and show how a wire bonding tool 10 is used to form a ball bump on a semiconductor die 12. The ball bump is to be formed on a bond pad 14 of the die, which is formed in accordance with conventional methods. Semiconductor die 12 may be any one of known types of semiconductor devices, including microprocessors, digital signal processors, memories, application specific integrated circuits and the like. Likewise, bond pad 14 may be formed in any conventional manner using conventional materials. For example, the pad may be made of aluminum or an aluminum alloy.

FIG. 1 illustrates a first step in practicing a method in accordance with the present invention. Wire bonding tool 10 includes a heated pedestal 16 onto which semiconductor die 12 is placed. The pedestal is heated to provide energy for the bond formation. A typical heating range is on the order of 150°–200° C. Wire bonding tool 10 also includes a capillary 18 for holding a conductive wire 20. Capillary 18 includes a bottom face 22, a feed hole 24 for receiving the conductive wire, and a chamfer 26 at the end of the feed hole where the feed hole meets the bottom face. Wire bonding tool 10 also includes a wire clamp 28, which as illustrated in FIG. 1 is in a open position. In a preferred embodiment, conductive wire 20 is a gold wire, although aluminum, copper, and solder wires may be used instead.

As illustrated in FIG. 1, the first step of the present invention involves forming a softened or molten portion at the end of conductive wire 20. This molten portion will be in the form of a ball 30 as illustrated in FIG. 1. Ball 30 may be formed at the end of conductive wire 20 by a variety of known methods, including high voltage spark (electronic flame off) and hydrogen flame.

Figure 2:
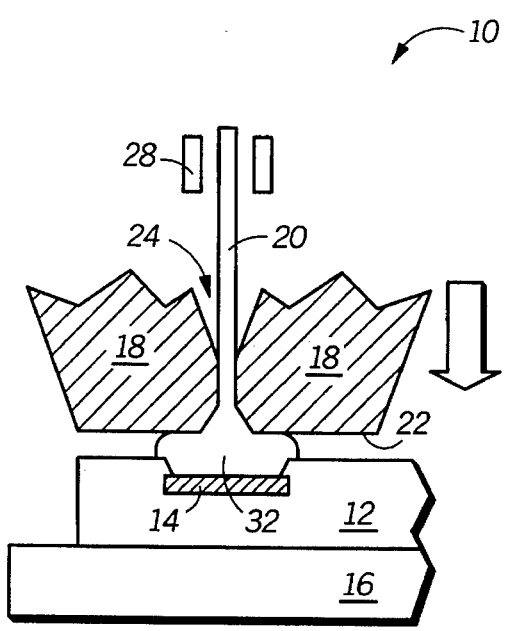

After formation of ball 30, capillary 18 is vertically lowered toward bond pad 14 as illustrated in FIG. 2. In lowering capillary 18, feed hole 24 and chamfer 26 are approximately centered over bond pad 14. The formed ball is brought into contact with the bond pad and the capillary forcibly presses the ball against the pad to form a ball bond 32. To form a physical connection between the ball bond 32 and pad 14, ultrasonic motion can be used to supply additional energy to the bond pad metal and ball metal, which upon cooling forms a metallurgical bond. Alternatively a metallurgical bond could be formed by a thermo-compression technique. As shown in FIG. 2, wire clamp 28 remains in the open position while the capillary is being lowered so that the wire may be freely drawn to the pad.

Figure 3:
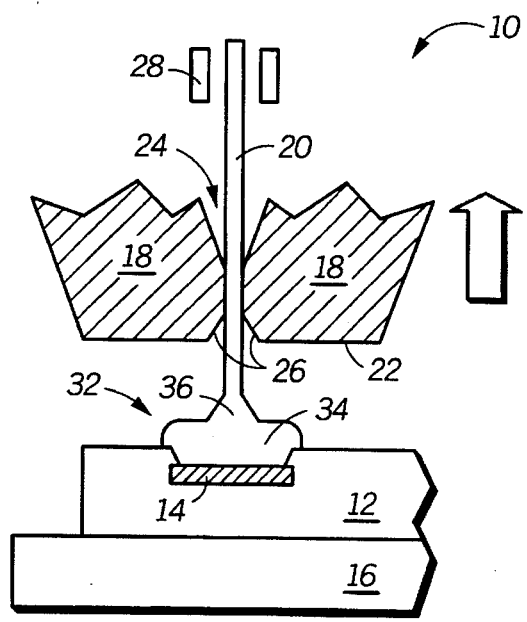

Next, capillary 18 is vertically retracted or raised away from the semiconductor die, as illustrated in FIG. 3. Wire clamp 28 remains open during the capillary retraction. FIG. 3 more clearly illustrates the shape of ball bond 32 which was formed in FIG. 2. The shape of ball bond 32 can generally be described as a kiss shape having a round base portion 34 and a conical protrusion 36 formed on top of the base portion. The shape of protrusion 36 is caused by the presence of chamfer 26 in the capillary. Upon forcing the capillary against the softened metal of ball 30 as in FIG. 2, the metal is forced into the chamfer portion. Upon raising the capillary, the molded shape is retained. The base portion surrounding protrusion 36 is essentially flat as a result of being pressed against bottom face 22 of the capillary during the ball bond formation illustrated in FIG. 2. Protrusion 36 is an impediment for certain bump applications, particularly for TAB bonding. In accordance with the present invention, protrusion 36 is coined or flattened using capillary 18 as described below.

Figure 4:
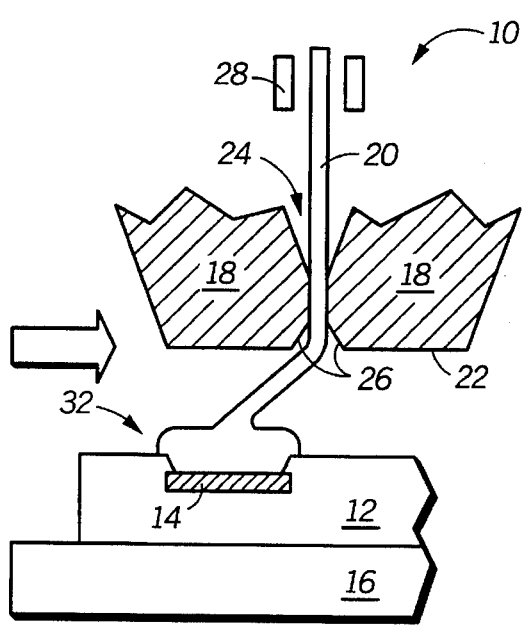

After retracting the capillary from ball bond 32, capillary 18 is horizontally displaced as illustrated in FIG. 4. The horizontal displacement is preferably in a direction toward the center of the semiconductor die rather than toward an adjacent bond pad for reasons to be explained below. The distance of horizontal displacement is explained in reference to FIG. 5. Clamp 28 remains open during the horizontal movement keeping conductive wire 20 physically connected to the ball bond 32.

Figure 5:
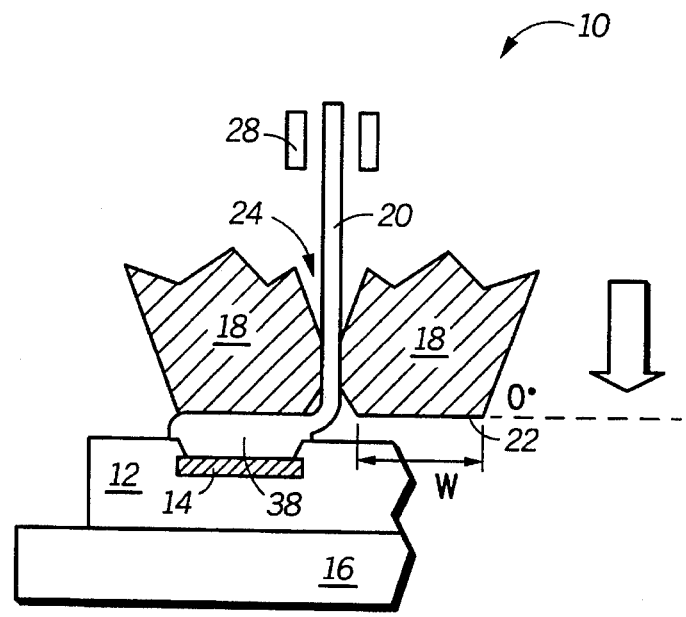

After horizontally displacing the capillary, the capillary is again lowered while keeping clamp 28 in an open position as illustrated in FIG. 5. In lowering capillary 18, one side of bottom face 22 of capillary 18 is pressed upon the ball bond, thereby flattening protrusion 36 to form a flattened ball bump 38. In accordance with the present invention, the entire ball bump 38 lies directly beneath one side of bottom face 22, such that the entire bump is directly beneath the bottom face and there is full contact between the bump's top surface and bottom face of the capillary. Stated otherwise, the overall diameter of ball bump 38 upon flattening is less than a width of bottom face 22, wherein the width of bottom face 22 is defined as being the distance from an outer edge of capillary 18 at the bottom face to chamfer 26, as shown in FIG. 5 as "W". By having the width of bottom face 22 larger than the ball bump diameter, an entire top surface of the ball bump is flattened. FIG. 5 also illustrates that in using the entire width of bottom face 22 for flattening, chamfer 26 is located at or beyond the ball bump perimeter and feed hole 24 is located beyond the ball bump perimeter during the flattening process. Accordingly, the extent of horizontal displacement needed in FIG. 4 is that distance which is necessary to bring the chamfer 26 and feed hold 24 beyond the ball bump perimeter during the flattening process shown in FIG. 5, allowing the entire top surface of the bump to be flattened by the bottom face. The actual distance will vary depending upon the original size of ball bond 32, the diameter of bottom face 22, and the diameter of chamfer 26.

In a preferred embodiment of the present invention, bottom face 22 is a zero degree face. Face angles of capillaries are generally defined by degrees in which the bottom face makes an angle when the capillary is pressed against a flat horizontal surface. A zero degree face angle is one in which the entire bottom face of the capillary is in contact with a planar surface. In other words, there is no gap between the bottom face and the flat surface against which it is pressed. The reason a zero degree face is preferred is to provide the flattest possible surface for ball bump 38. Also in a preferred embodiment, the outer diameter of the capillary (meaning the outer diameter of bottom face 22) does not have an outer radius. Rather, the flat bottom face meets the outer edge of the capillary at a precise angle, rather than being rounded. The preference for not having an outer radius is to provide the maximum width for bottom face 22 while minimizing the overall size of the capillary. In general, it is desired to keep the capillary as small as possible to avoid interference between the capillary and adjacent, subsequently formed bonds.

Figure 6:
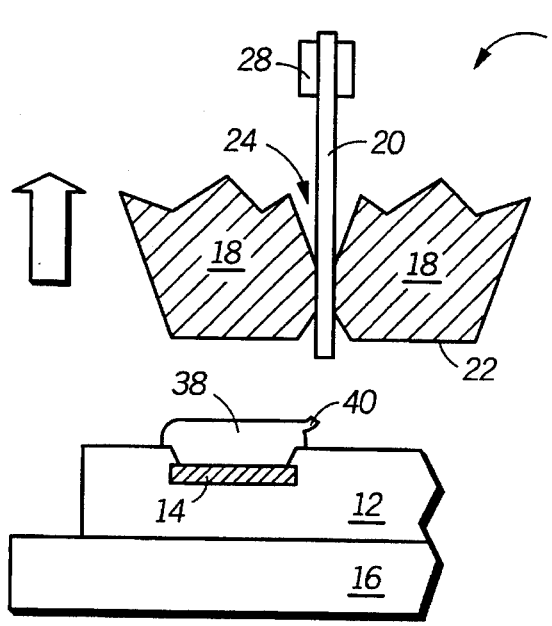

After flattening the protrusion to form ball bump 38, wire clamp 28 is closed and capillary 18 is raised as shown in FIG. 6. The result is to break conductive wire 20 at its weakest point, which is the point at which the wire was kinked between bottom face 22, chamfer 26, and feed hold 24 during the flattening process of FIG. 5. As a result of breaking the wire, a very small protrusion 40 may be left with ball bump 38. However, protrusion 40 does not impede in any subsequent operation involving bonding ball bump 38 to a TAB lead or to a substrate. One reason is that protrusion 40 is much smaller than original protrusion 36. For example, the diameter of protrusion 40 is on the order of 1 mil (0.025 mm), and the length of protrusion 40 is on the order of 1 to 1.5 mils (0.025–0.040 mm). In contrast, the diameter of protrusion 36 may be as large as 2.5 mils (0.065 mm), while the height of protrusion 36 may be as high as 3 to 4 mils (0.075–0.100 mm). Further, protrusion 40 is not an impediment to subsequent bonding because protrusion 40 does not lie on the top surface of ball bump 38 rather it extends beyond the ball bump perimeter. This is shown more clearly in reference to FIG. 7, which is a perspective view of ball bump 38.

Figure 7:
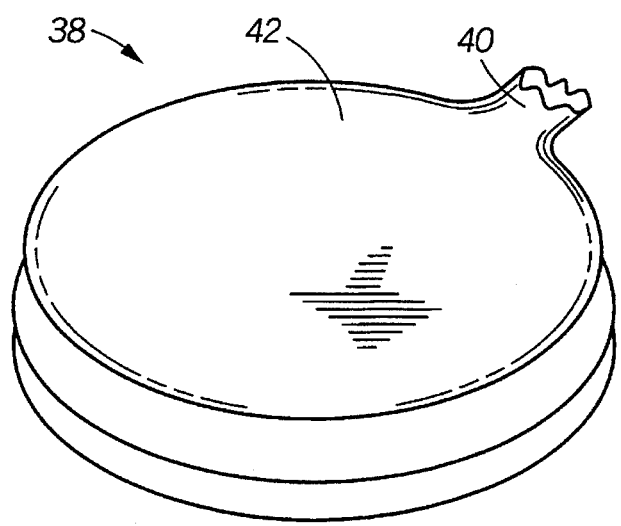
FIG. 7 is a perspective view of a ball bump formed on the die as a result of performing the process of FIGS. 1–6.

As illustrated in FIG. 7, ball bump 38 has a top surface 42 which is flat across essentially the entire overall ball bump diameter. Top surface 42 is so flat and so large as a result of using the entire width of bottom face 22 during the flattening operation. As also shown in FIG. 7, protrusion 40 begins at the very edge of top surface 42, and extends at a slight upward angle beyond the perimeter of the ball bump. Accordingly, protrusion 40 will not impact subsequent bonding of TAB leads or substrate to top surface 42. Protrusion 40 begins at the edge of the perimeter of the top surface and the ball bump and extends beyond the bump perimeter because during the flattening process chamfer 26 and feed hole 24 were positioned at or beyond the bump perimeter. Thus upon raising the capillary after flattening, the wire breaks at a point at or beyond where bottom face 22 meets chamfer 26.

Figure 8:
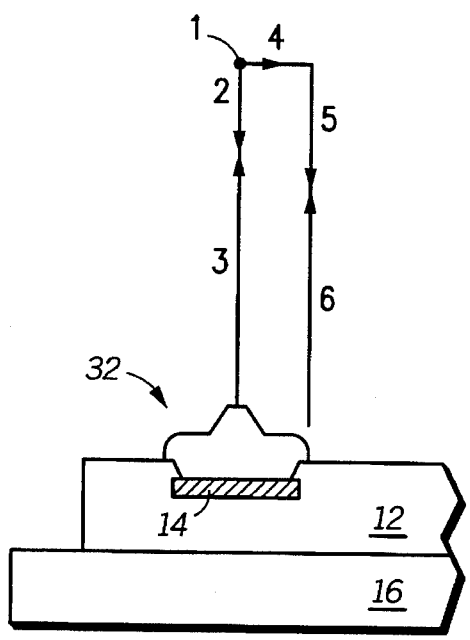
FIG. 8 schematically illustrates the capillary motion used in the process of FIGS. 1–6.

FIG. 8 is included to show the relative positions of the capillary throughout the processes described in FIGS. 1–6. As shown in FIG. 8, the capillary motions are numbered to correspond to the figure number in which the capillary motion was described and illustrated. For example, the starting position of the capillary is labeled 1, the vertical downward motion used to form ball bond 32 is labeled as 2, the first retraction of the capillary is labeled 3, the horizontal displacement of the capillary is labeled 4, the lowering of the capillary to flatten the protrusion of the ball bond is labeled 5, and the final retraction of the capillary to terminate the wire is labeled 6.

Figure 9:
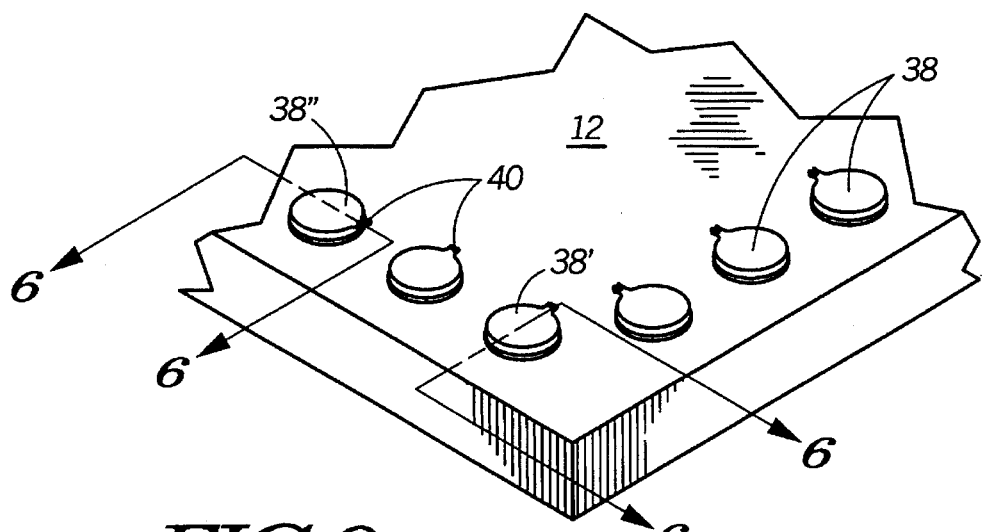
FIG. 9 is a perspective view of a portion of a semiconductor die illustrating how a plurality of ball bumps may be formed in accordance with the present invention.

FIG. 9 is a perspective view of a portion of semiconductor die 12 having a plurality of ball bumps 38 formed thereon in accordance with the present invention. As illustrated in FIG. 9, ball bumps 38 are formed around a perimeter or periphery of semiconductor die, however this is not a necessary requirement of the present invention. Also as illustrated, a majority of protrusions 40 which may be formed on ball bumps 38 are directed toward the interior or center of semiconductor die 12. While this is not a requirement of the present invention, it may be preferred in devices which have tight bond pad pitches. The direction at which protrusions 40 will be pointed is dependent upon the direction of horizontal displacement chosen in the process illustrated in FIG. 4. If horizontal displacement is chosen to be in a direction toward the center of semiconductor die, that is the direction in which any protrusions 40 which may be formed will also point. For example, in reference to the formation of a ball bump 38' as illustrated in FIG. 9, the processes as illustrated in FIGS. 1–6 would be representative cross-sectional through the line 6—6 through ball bump 38' of FIG. 9. As a result of horizontally displacing capillary 18 toward the center of the die in the step illustrated in FIG. 4, protrusion 40 which is formed as a result of terminating the wire in FIG. 6 would be pointed toward the center of semiconductor die 12. Compare this to performing the processes of FIGS. 1–6 as viewed from a cross-section through the line 6—6 through a ball bump 38" of FIG. 9, wherein the horizontal displacing of capillary 18 in the step illustrated in FIG. 4 is toward an adjacent bond pad. In performing the wire termination step illustrated in FIG. 6 through the cross-section of ball bump 38", protrusion 40 would be left on ball bump aiming not at the center of semiconductor die 12, but rather aimed at an adjacent ball bump as illustrated in FIG. 9. Horizontally displacing the capillary toward an adjacent bond pad is within the scope of the present invention; however, one may need to consider the proximity of the next adjacent bond pad to avoid capillary interference with previously formed ball bumps. For example, in reference to FIG. 5, one may not wish to horizontally displace the capillary in a direction toward an adjacent bond pad if, as a result, the other half of bottom face 22 would interfere with a previously formed ball bump or ball bond. Whether or not there would be such interference would be dependent upon the bond pad pitch of the die and the outer diameter of bottom face 22. To avoid any potential interference with adjacent bond pads, ball bumps, or ball bonds, the capillary can simply be horizontally displaced toward the interior or center of semiconductor die 12.

The foregoing description and illustrations contained herein demonstrate many of the advantages associated with the present invention. In particular it has been revealed that ball bumps formed on a semiconductor device can be formed with a top surface which is flat across essentially the entire diameter of the ball bump, allowing for unimpeded subsequent bonding of the bump to TAB leads or to a substrate. Moreover, the process used to form these bumps can be performed using conventional wire bonding equipment which imposes lower manufacturing costs as compared to methods for forming conductive bumps which involve deposition. Furthermore, the present invention provides a method in which the ball bumps are simultaneously formed and coined such that two separate operations for forming the ball bonds and subsequently coining are unnecessary.

Thus it is apparent that there has been provided in accordance with the present invention a method for ball bumping a semiconductor device that fully meets the needs and advantages set forth above. Although the invention has been described and illustrated with reference to specific embodiments, it is not intended that the invention be limited to these illustrative embodiments. Those skilled in the art will recognize that modifications and variations can be made without departing from the spirit of the invention. For example, the precise capillary dimensions, particularly the bottom face width, can only be defined in reference to the desired size of the ball bump formed. A variety of capillary sizes are available commercially, many of which can be used in accordance with the present invention. Likewise, the chamfer diameter, inner chamfer angle, and shape of the capillary may also vary. In addition, the invention is not limited to the specific materials mentioned herein. For example, the conductive wire used may be of any material available for such application. It is also important to note that the present invention is not limited in any way to the number of ball bumps formed on a semiconductor device, the location of the ball bumps formed on the semiconductor device, or the order in which these ball bumps are formed. Furthermore, the step in which the capillary is horizontally displaced (illustrated in FIG. 4) is not limited to only horizontal displacement. There may be both horizontal and vertical components to the capillary movement. Therefore, it is intended that this invention encompass all such variations and modifications as fall within the scope of the appended claims.

I claim:

1. A method for ball bumping a semiconductor device comprising the steps of:

providing a semiconductor die having a bond pad;

providing a wire bonding tool having a capillary, wherein the capillary has a feed hole therethrough for receiving a wire, a flat bottom face, and a chamfer surrounding the feed hole at the flat bottom face;

forming a ball bond on the bond pad by positioning the capillary in a first position, lowering the capillary toward the bond pad, and applying a force to form a ball bond, without breaking the wire;

raising the capillary away from the bond pad, without breaking the wire;

horizontally displacing the capillary to a second position; and flattening the ball bond to form a ball bump having a flat top surface, wherein flattening is achieved by lowering the capillary from the second position toward the bond pad and forcibly pressing a portion of the flat bottom face against the ball bump, wherein during lowering the capillary a center of the feed hole is beyond a perimeter of the ball bump formed and wherein during pressing the top surface of the ball bump is entirely in contact with the bottom face of the capillary.

2. The method of claim 1 further comprising, after the step of flattening, the steps of:

clamping the wire in the wire bonding tool to provide a clamped wire; and raising the capillary and the clamped wire away from the ball bump, wherein as a result the clamped wire breaks from the ball bump.

3. The method of claim 1 further comprising the step of breaking the wire from the ball bump, wherein as a result of breaking, a detectable wire protrusion is created as part of the ball bump.

4. The method of claim 3 wherein the step of breaking the wire comprises breaking the wire such that the detectable wire protrusion protrudes beyond a perimeter of the ball bump.

5. The method of claim 4 wherein the step of breaking the wire comprises breaking the wire such that the detectable wire protrusion begins to protrude from the perimeter of the ball bump.

6. The method of claim 1 wherein the step of flattening comprises flattening the ball bond to form a ball bump with a top surface having a diameter which is essentially equal to an overall diameter of the ball bump.

7. The method of claim 1 wherein the step of horizontally displacing comprises horizontally displacing the capillary to a second position which is closer to a center of the semiconductor die than the first position.

8. The method of claim 1 wherein the step of providing a wire bonding tool comprises providing a wire bonding tool wherein the flat bottom face of the capillary has a zero degree face angle.

9. A method for ball bumping a semiconductor device comprising the steps of:

providing a semiconductor die having a bond pad formed on a surface thereof;

providing a wire bonding tool having a capillary, wherein the capillary has a bottom face, an outer diameter, a feed hole extending to the bottom face, and a chamfer between the bottom face and the feed hole;

providing a wire through the feed hole of the capillary;

first lowering the capillary and the wire therein toward the bond pad such that the chamfer is approximately centered over the bond pad, and making contact between the wire and the bond pad in a first bonding action to form a ball bond;

first raising the capillary and the wire therein above the ball bond;

horizontally moving the capillary and the wire therein by a distance; and second lowering the capillary and the wire therein toward the semiconductor die and flattening the ball bond with a portion of the bottom face of the capillary in a second bonding action to form a ball bump;

wherein the step of horizontally moving comprises horizontally moving the capillary by a distance wherein upon second lowering the capillary, an entirety of the chamfer is at least at a peripheral edge of the ball bump; and wherein the step of second lowering comprises lowering the capillary to form a single flat surface across a top of the ball bump as a result of the bottom face of the capillary being in contact across the top of the ball bump.

10. The method of claim 9 wherein the step of second lowering comprises second lowering the capillary and the wire therein toward the semiconductor die and flattening the ball bond wherein upon flattening, an entire upper surface of the ball bump is in contact with a portion of the bottom face of the capillary.

11. The method of claim 9 wherein the step of second lowering comprises lowering the capillary and the wire therein toward the semiconductor die and flattening the ball bond, and wherein during flattening, essentially an entirety of the ball bond is directly beneath the bottom face of the capillary.

12. The method of claim 9 further comprising the step of second raising the capillary to break the wire, thereby leaving a wire protrusion on the ball bump.

13. The method of claim 12 wherein the step of second raising comprises second raising the capillary to break the wire, thereby leaving a wire protrusion on the ball bump, and wherein the wire protrusion protrudes beyond a perimeter of the ball bump.

14. The method of claim 12 wherein as a result of second lowering and second raising, the ball bump has an exposed upper surface which is substantially flat across an entire diameter of the ball bump.

15. A method for ball bumping a semiconductor die comprising the steps of:

providing a semiconductor die having a bond pad;

providing a wire bonding capillary having a bottom face, a feed hole, and a chamfer at an end of the feed hole near the bottom face, wherein the bottom face has an outer diameter, and has a width measured from an outer edge of the bottom face to the chamfer;

providing a wire within the feed hole of the capillary;

forming a ball bond on the bond pad by lowering the capillary toward the bond pad and forcibly pressing the wire to the bond pad;

raising the capillary away from the bond pad;

displacing the capillary by a horizontal distance; and flattening the ball bond to form a ball bump by lowering the capillary and forcibly contacting the bottom face of the capillary against the ball bond, wherein as a result of forcibly contacting, the ball bump formed has a diameter at a top surface of the ball bump which is at most equal to the width of the bottom face of the capillary.

16. The method of claim 15 wherein the step of flattening comprises forcibly contacting the bottom face of the capillary against the ball bond such that the ball bond lies essentially entirey directly beneath the bottom face of the capillary.

17. The method of claim 15 wherein the step of providing a wire bonding tool comprises providing a wire bonding tool wherein the bottom face of the capillary has a zero degree face angle.

18. The method of claim 15 wherein during the step of flattening, the feed hole of the capillary lies beyond a perimeter of the ball bump.

19. The method of claim 15 further comprising, after the step of flattening, the steps of:

clamping the wire; and retracting the capillary and breaking the wire from the ball bond, wherein as a result of breaking, a wire protrusion is formed which laterally extends from a top surface of the ball bump.

20. The method of claim 19 wherein the step of displacing the capillary by a horizontal distance comprises displacing the capillary in a horizontal distance toward a center of the semiconductor die.

* * * * *

UNITED STATES PATENT AND TRADEMARK OFFICE
CERTIFICATE OF CORRECTION

PATENT NO. : 5,559,054
DATED : September 24, 1996
INVENTOR(S) : Waseem Adamjee

It is certified that error appears in the above-indentified patent and that said Letters Patent is hereby corrected as shown below:

Column 8, line 57, (claim 16, line 4), after "essentially" replace "entirey" with --entirely--.

Signed and Sealed this

First Day of July, 1997

Attest:

Attesting Officer

BRUCE LEHMAN
Commissioner of Patents and Trademarks